United States Patent [19]

Magdo et al.

[11] 3,954,523
[45] May 4, 1976

[54] PROCESS FOR FABRICATING DEVICES HAVING DIELECTRIC ISOLATION UTILIZING ANODIC TREATMENT AND SELECTIVE OXIDATION

[75] Inventors: Ingrid E. Magdo; Steven Magdo, both of Hopewell Junction; William J. Nestork, Wappingers Falls, all of N.Y.

[73] Assignee: International Business Machines Corporation, Armonk, N.Y.

[22] Filed: Apr. 14, 1975

[21] Appl. No.: 567,562

[52] U.S. Cl. .............................. 148/175; 29/577; 29/578; 156/7; 156/17; 204/15; 204/129.3; 204/129.65; 357/40; 357/49; 357/50
[51] Int. Cl.² ................. H01L 21/76; B23P 1/00; H01L 27/12
[58] Field of Search ........... 148/175; 204/15, 129.3, 204/129.65; 29/577, 578; 357/40, 50; 156/7

[56] References Cited
UNITED STATES PATENTS

| | | | |
|---|---|---|---|
| 3,386,865 | 6/1968 | Doo .................................. | 148/175 |
| 3,442,011 | 5/1969 | Strieter ............................. | 357/49 X |
| 3,602,982 | 9/1971 | Kooi ................................. | 148/175 X |
| 3,640,806 | 2/1972 | Watanabe et al. ................ | 357/49 X |
| 3,648,125 | 3/1972 | Peltzer .............................. | 357/50 |
| 3,661,741 | 5/1972 | Meek ................................ | 204/129.3 |

FOREIGN PATENTS OR APPLICATIONS

| | | | |
|---|---|---|---|
| 102,988 | 12/1973 | Japan ............................... | 204/129.3 |

OTHER PUBLICATIONS
Chappelow et al., "Dielectric Isolation . . . Circuit Device," I.B.M. T.D.B., Vol. 16, No. 1, June 1973, p. 31.
Peltzer et al., "Isolation Method . . . Memories," Electronics, Mar. 1, 1971, pp. 52–55.

*Primary Examiner*—L. Dewayne Rutledge
*Assistant Examiner*—W. G. Saba
*Attorney, Agent, or Firm*—Wolmar J. Stoffel

[57] ABSTRACT

A process for forming complete dielectrically isolated monocrystalline silicon regions on a substrate by depositing a first epitaxial silicon layer embodying an N-type impurity on a low resistivity silicon substrate embodying a P-type impurity, forming annular P-type impurity regions in the first epitaxial layer, depositing the second epitaxial layer embodying an N-type impurity on the first epitaxial layer, forming annular P-type impurity regions in the second epitaxial layer in registry with the annular regions in the first epitaxial layer, converting the silicon substrate and the annular P-type regions in the first and second epitaxial layers into porous silicon material by an anodic treatment carried out in an aqueous solution of hydrofluoric acid, and oxidizing the porous silicon material to form silicon oxide.

A semiconductor structure having a backing substrate of silicon oxide with monocrystalline silicon islands embedded therein. A preferred embodiment includes low resistivity regions that extend through the substrate.

10 Claims, 8 Drawing Figures

PROCESS FOR FABRICATING DEVICES HAVING DIELECTRIC ISOLATION UTILIZING ANODIC TREATMENT AND SELECTIVE OXIDATION

DESCRIPTION OF THE PRIOR ART

This invention relates to a process for forming dielectrically isolated regions by means of an electrolytic operation in an aqueous solution of hydrofluoric acid.

In integrated circuit applications, various active and passive devices are formed on a monocrystalline silicon or other type semiconductor substrate. These active and passive devices must ordinarily be electrically isolated from each other in order to provide operative circuits. Various types of electrical isolation structure have been proposed and used. A common well-known type of isolation is known as junction isolation wherein the individual active and passive devices are surrounded by a back-biased PN junction. However, as the integrated circuit technology became more developed, the sizes of the devices became smaller. However, junction isolation did not permit the desired degree of miniaturization since the regions in a device, as for example a transistor, must be spaced from the isolation junction by at least the width of the depletion region. This provided a serious constraint on the use of junction isolation. Further, the presence of an additional junction in the device, particularly as the size of the devices became smaller, introduced a significant amount of capacitance which reduced the speed of operation. The junction isolation also introduces parasitic transistors. This parasitic effects such as SCR action are especially serious if complementary pairs of bipolar or MOS transistors are fabricated.

Another form of isolation in semiconductor devices is dielectric isolation. In this structure, a wall or layer of dielectric material completely surrounds the active and passive devices of the integrated circuit device. This structure permits much closer spacing of the device as compared to junction isolation, and also has significantly less parasitic capacitance. However, fabricating the structure is very complex and demanding. Initially, dielectric isolation was achieved by etching a grid of channels in a semiconductor wafer, oxidizing the resultant surface, depositing a relatively thick layer of polycrystalline material, and subsequently abrading the original back side of the initial wafer away leaving only the portions surrounded by the polycrystalline backing material. This set of operations, particularly the abrading operation, is very complex, tedious and demanding.

Another type of electrical isolation consists of a combination of junction isolation and dielectric isolation. In this structure, the sidewalls of the active and passive devices are isolated by a wall or layer of dielectric material and the bottom surface isolated by a back-biased PN junction. An early example of this type of isolation is illustrated in U.S. Pat. No. 3,386,865. A subsequent technique for forming this general type of isolation is described in U.S. Pat. No. 3,648,125.

In commonly assigned Application Ser. No. 479,321, there is disclosed and claimed a process for achieving complete dielectric isolation of monocrystalline silicon regions on a semiconductor substrate by first converting monocrystalline silicon regions to porous silicon and subsequently oxidizing these regions. The backing element is monocrystalline silicon. As the semiconductor devices become larger, there exists a need for matching the coefficient of expansion of the chip and the supporting module, particularly when the substrate is bonded to the device with solder contacts. When the coefficient of expansion of the device and substrate do not match within reasonable limits, a possibility of breaking the solder bonds exists during thermal cycling. Thus, there is a pressing need for a process for forming dielectrically isolated monocrystalline regions supported on a material, as for example quartz, which can also be used as a substrate material.

SUMMARY OF THE INVENTION

It is an object of this invention to provide a method for forming completely dielectrically isolated monocrystalline semiconductor regions on a substrate.

It is another object of this invention to provide a process for forming monocrystalline silicon regions supported on a base substrate of silicon oxide.

It is another object to provide a new semiconductor device structure having monocrystalline islands supported on an $SiO_2$ substrate.

Yet another object of this invention is to provide a process for forming dielectrically isolated monocrystalline silicon regions wherein the upper portions of the regions are isolated by thermally oxidized monocrystalline silicon and the lower regions by a more rapidly oxidizable material that results in silicon oxide.

In this process for forming completely dielectrically isolated monocrystalline silicon regions on a substrate, a first epitaxial silicon layer embodying an N-type impurity is deposited on a low resistivity silicon substrate embodying a P-type impurity, and annular P-type impurity regions are formed in the first epitaxial layer that define the ultimate isolation regions, a second epitaxial silicon layer embodying an N-type impurity is deposited on the first epitaxial layer, annular P-type impurity regions are formed in the second epitaxial layer in registry with the annular regions in the first epitaxial layer, the silicon substrate and the annular P-type regions in the first and second epitaxial layers are converted into porous silicon material by anodic treatment carried out in an aqueous solution of hydrofluoric acid, and the porous silicon material is subsequently oxidized to form silicon oxide.

A preferred specific embodiment of the process includes the forming in the second epitaxial layer annular recessed thermally oxidized silicon regions overlying the annular P-type regions in the first and second layers. This process results in structure that is a combination of thermally oxidized silicon dielectric material in combination with oxidized porous silicon material.

A semiconductor structure having a backing substrate of silicon oxide with monocrystalline silicon islands embedded therein. A preferred embodiment includes low resistivity regions that extend through the substrate.

DESCRIPTION OF THE PREFERRED EMBODIMENTS

Figure 4:
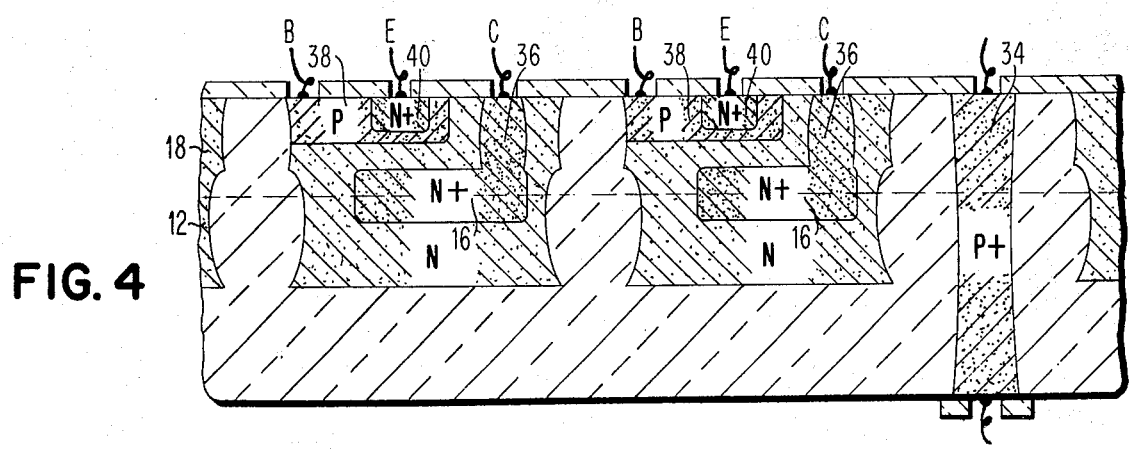

Referring now to the figures of the drawings and FIGS. 4–4 in particular, there is depicted a sequence of views illustrating the structure of the semiconductor substrate at various stages of the process. The dimensions of the figures, particularly the vertical direction, are not necessarily drawn to scale.

Figure 1:
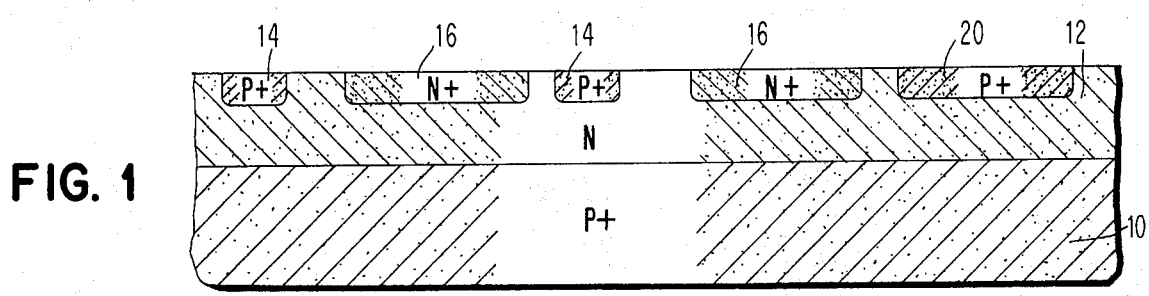
FIGS. 1–4 is a sequence of elevational views in broken section of a semiconductor substrate illustrating the various stages during practice of the method of the invention.

Referring now to FIG. 1, on a low resistivity monocrystalline silicon wafer 10 embodying a P-type dopant, there is deposited an epitaxial layer 12 embodying an N-type dopant, utilizing standard epitaxial deposition techniques. The resistivity of wafer 10 should be as high as possible preferably greater than $10^{19}$ atoms/cc. The thickness of wafer 10 is typically on the order of 4 to 15 mils. The thickness of silicon epitaxial layer 12 can be of any suitable thickness, typically in the range of 1 $\mu$m to 3 $\mu$m. The resistivity of layer 12 depends on the particular application the resultant device will be used for, and is typically on the order of 0.1–1 ohm cm. Generally, annular P-type impurity regions 14 are formed in epitaxial layer 12 using any convenient method of introducing the impurity into the layer, as for example diffusion or ion implantation. Annular regions 14 in general surround the desired ultimate monocrystalline silicon regions in the device. Regions 14 are formed using conventional known mask or ion implantation techniques. When transistors are desired to be formed in the monocrystalline regions, it is desirable that low resistivity regions 16 embodying an N-type dopant be formed. Regions 16 will ultimately comprise the sub-collector regions of the transistors.

Figure 2:
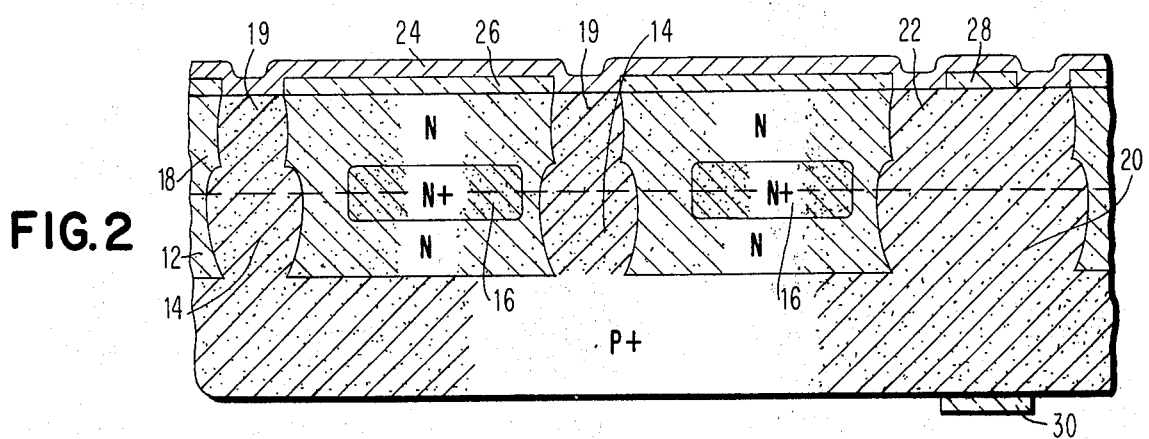

As shown in FIG. 2, a second epitaxial silicon layer 18 is deposited on the surface of layer 12, again using conventional epitaxial deposition techniques. The thickness of layer 18 can be any suitable thickness, typically on the order of 1–3 $\mu$m. After layer 18 is deposited, low resistivity annular P-type regions are formed in same that are in registry with regions 14. If layer 18 is very thin, the surface diffused regions 19 may not be required. The P-type regions 14 will out-diffuse during epitaxial growth of layer 18 to the surface.

Figure 3:
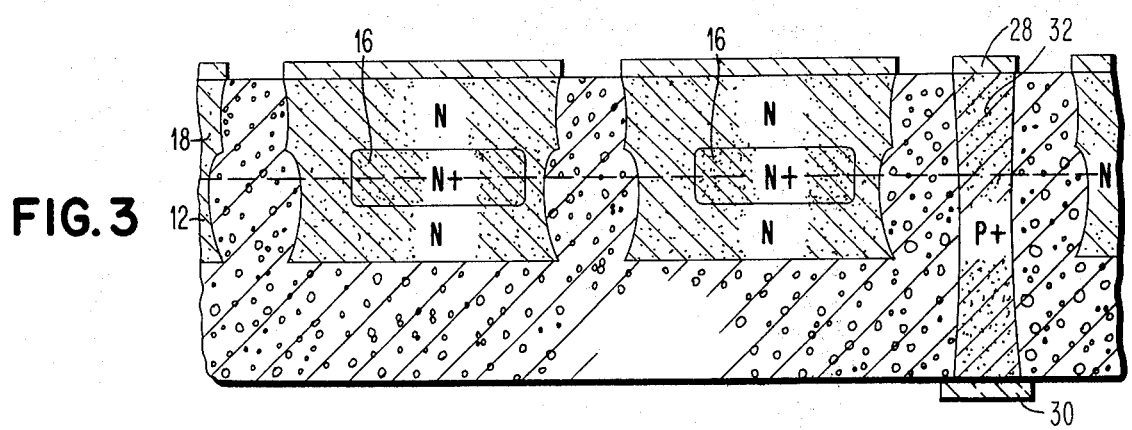

Another feature of the method of the invention is the forming of high conductivity regions that extend completely through the device. When high conductivity regions are formed, the region 20 in layer 12 and 22 in layer 18 are normally wider than the corresponding regions 14 and 19. The width of regions 20 and 22 are in the range of 250 $\mu$m. The reason for the enlarged P-type regions 20 and 22 will become more apparent in the description that follows. Subsequently, a layer of metal 24 is deposited over dielectric layer 26 which is oxidation resistant as shown in FIG. 2. Layer 26 is preferably $Si_3N_4$ as a composite layer such as $SiO_2$ and $Si_3N_4$. Layer 24 makes electrical contact to regions 19 and 22. When a high conductivity region is desired in the device, additional area 28 and 30 of dielectric material are deposited on the top surface and the bottom surface, respectively. Regions 28 and 30 and also 26 are masking layers which are arranged in opposing relation over the P-type regions 20 and 22. The wafer is then made the anode in an aqueous HF solution and the P-type regions 14, 19, 20 and 22 and the P-type substrate 10 are converted to porous silicon. The process for converting monocrystalline silicon to porous silicon is described in detail in U.S. Pat. No. 3,640,806 and also in commonly assigned patent application Ser. No. 479,321. In general, the device as shown in FIG. 2 is made the anode with electrical contact being made to layer 24, in an aqueous HF solution. The aqueous HF solution is in contact with the bottom side of the silicon substrate, thus the porous conversion starts from the back of the wafer. The current density, the temperature of the solution, and the time of anodization are preferably adjusted to produce an average porosity of at least 56 percent in the resultant P-type regions and substrate 10. The N-type regions in epitaxial layers 12 and 18 are not converted to porous silicon. The structure resulting from the conversion is illustrated in FIG. 3. Note that the P-type material between the masking layers 28 and 30 is not converted to porous silicon. The structure shown in FIG. 3 is then oxidized in an oxidizing environment, as for example steam, at 1000°C for a period sufficient to convert the porous silicon to silicon oxide. Porous silicon oxidizes much faster than solid silicon. Thus, it is feasible to oxidize through a 15 mil thick wafer. The preferred wafer thickness is about 4 mils.

As shown in FIG. 4, the monocrystalline regions of the device are surrounded on the bottom and sides by silicon oxide. In like manner, the elongated P-type region 32 between contacts 28 and 30 is also surrounded by silicon oxide and thus effectively isolated from the devices on the substrate. As shown in FIG. 4, a reach through diffusion 36 is made to contact the sub-collector region 16 and base and emitter diffusions 38 and 40, respectively, made to complete the transistors. Electrical contacts to the emitter base and collector are then made utilizing conventional fabrication techniques.

Figure 5:
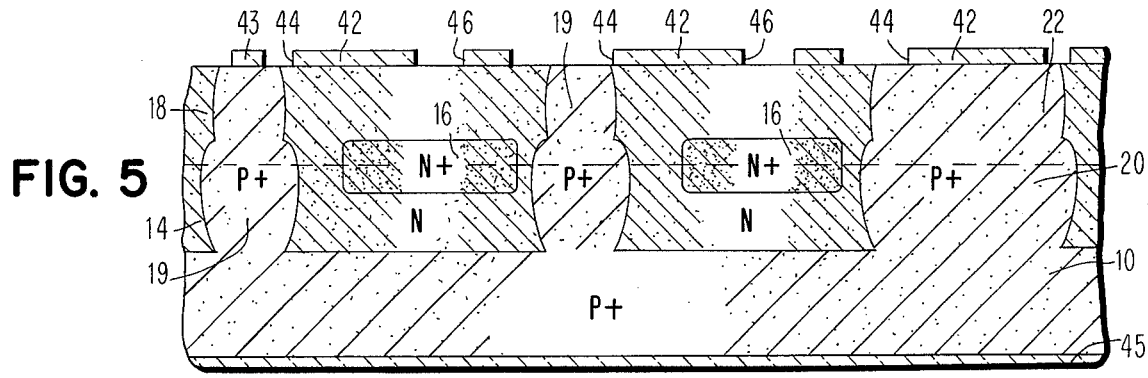
FIGS. 5–8 depict a sequence of elevational views in broken section of a semiconductor substrate illustrating a second preferred specific embodiment of the method of the invention.
Figure 6:
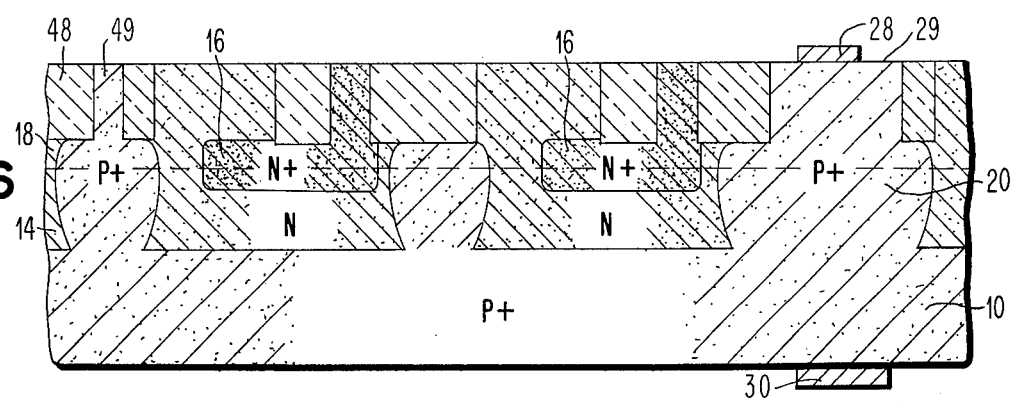

Referring now to FIGS. 5–8, there is illustrated another preferred specific embodiment of our invention for forming dielectric isolation which embodies both thermally oxidized monocrystalline silicon and thermally oxidized porous silicon. The structure shown in FIG. 5 is similar to the structure illustrated in FIG. 2 and is correspondingly numbered. However, prior to converting the P-type regions to porous silicon, the surface is masked with an oxidation resistant mask 42 which leaves portions of the surface of the device exposed where it is desired that recessed oxide regions are to be formed. Note that annular openings 44 are provided in masking layer 42 which generally overly the regions 19 that surround the monocrystalline silicon regions of the device. In addition, openings 46 are provided which will result in recessed oxide region that surrounds the collector reach-through contact shown more clearly in FIG. 6. In addition, a layer portion 43 is provided over the P-type regions to prevent oxidation of selected portions of the P-type regions which will thereby provide an electrical contact to the underlying P-type regions during their conversion to porous silicon. The back side of wafer 10 is preferably masked with oxidation resistant layer 45. With the mask 42 in place, the exposed silicon is etched to a depth of about 0.4 $\mu$m, the device is then exposed to an oxidizing environment at an elevated temperature to form the recessed oxide regions 48 of about 1 $\mu$m deep as shown in FIG. 6.

Figure 7:
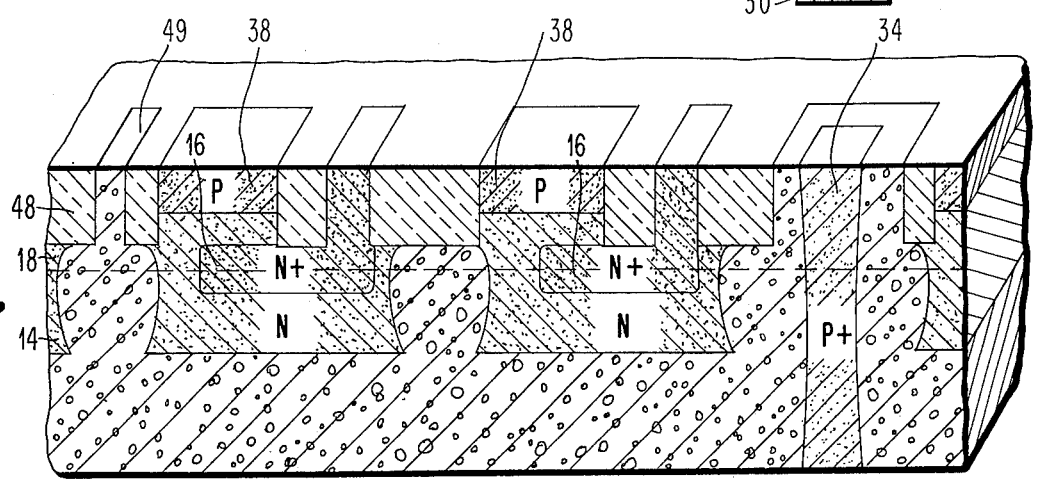
Figure 8:
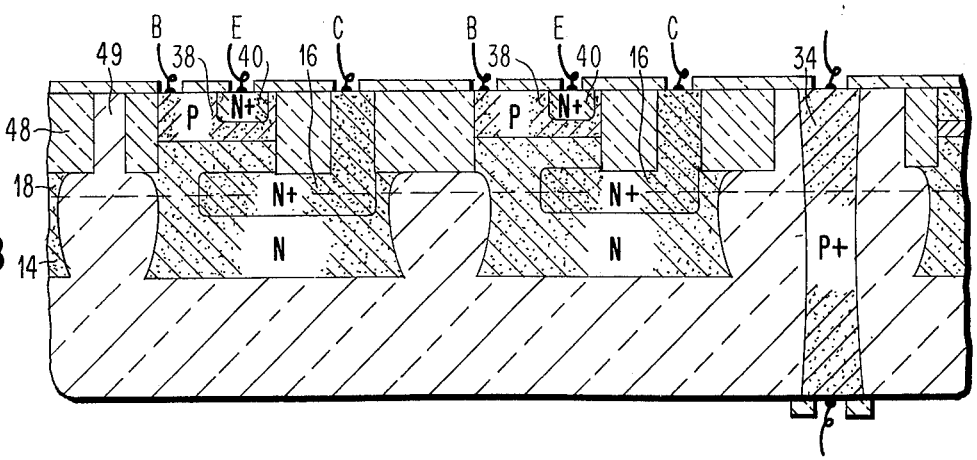

Masking layers 42 and 45 are removed when high conductivity reach-through regions are to be formed in the device, and dielectric layer portions 28 and 30 are provided in opposing relation. The device is then subjected to an anodization step wherein the P-type impurity regions are converted to porous silicon. Note that regions 49 and 29 are provided to establish electrical contact from the top side of the wafer through the recessed oxide region 43. These contact openings can be formed through the recessed oxide layer wherever necessary. Following the conversion to porous silicon, the P-type region as well as the P-type substrate 10 are oxidized in an oxidizing environment as previously described. This results in a silicon oxide substrate as well as silicon oxide dielectric isolation surrounding the monocrystalline regions. The high conductivity reach-through region 34 is also formed as shown in FIG. 7 and described previously. A base region 38 is formed by diffusing a P-type impurity from the surface after masking off the appropriate collector reach-through contacts. As shown in FIG. 8, the emitter regions 40 are formed using conventional diffusion or ion implantation techniques, electrical contacts made to the various regions, and a passivating layer provided. In the isolated monocrystalline region, devices other than NPN transistors can be fabricated. For instance, the present invention is very attractive for complementary pairs of both bipolar and MOS devices since parasitic effects like SCR action is eliminated.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A process for forming completely dielectrically isolated monocrystalline silicon regions on a substrate comprising:
   depositing a first epitaxial silicon layer embodying an N-type impurity on a low resistivity silicon substrate embodying a P-type impurity,
   forming annular P-type impurity regions in said first epitaxial layer that define ultimate isolation regions,
   depositing a second epitaxial silicon layer embodying an N-type impurity on said first epitaxial layer,
   forming annular P-type impurity regions in said second epitaxial layer in registry with said annular regions in said first epitaxial layer such that said P-type impurity regions in said first and said second epitaxial silicon layers merge to extend through said epitaxial layers,
   converting said silicon substrate and said annular P-type regions in said first and said second epitaxial layers into porous silicon material by an anodic treatment carried out in an aqueous solution of hydrofluoric acid, and
   oxidizing said porous silicon material to form silicon oxide, said silicon oxide surrounding and electrically isolating monocrystalline silicon regions of said first and second epitaxial layers.

2. The process of claim 1 wherein low resistivity N-type regions are formed in said first epitaxial layer.

3. The process of claim 2 wherein a dielectric layer is initially deposited on the surface of said second epitaxial layer and annular portions removed over said annular P-type regions in said first epitaxial layer, a P-type impurity is diffused through the resultant annular openings forming said impurity regions, a blanket metal layer is deposited over said dielectric layer, and during said anodic treatment, said metal layer forms the electrical contact to the substrate.

4. The process of claim 1 wherein additionally low resistivity regions are formed which extend completely through said substrate and said first and second epitaxial layers, said low resistivity regions formed by depositing dielectric masking layer portions over a P-type region on said second epitaxial layer, and a dielectric layer masking portion on the bottom of said substrate in opposed relation to said masking portion on said second epitaxial layer,
   the silicon material between said masking portions being shielded from the said anodic treatment.

5. The process of claim 2 wherein following the forming of said P-type regions in said second epitaxial layer, the surface of said second epitaxial layer is selectively masked with an oxidation resistant mask, the resultant exposed areas exposed to an oxidizing environment to form recessed regions of thermally oxidized silicon.

6. The process of claim 5 wherein said oxidation masking layer is formed with generally annular openings which overly said P-type regions in said first and second epitaxial regions.

7. The process of claim 6 wherein oxidation resistant masking layer includes a portion which overlies said low resistivity N-type region, said resultant recessed oxide regions defining a contact region for low resistivity N-type regions.

8. The process of claim 5 wherein said oxidation resistant mask is composite layer of a lower layer of $SiO_2$ and an overlaying layer of $Si_3N_4$.

9. The process of claim 5 wherein a portion of said oxidation resistant mask is located over said P-type region in said second epitaxial layer, said portion resulting in an opening in the recessed oxide region which provides an electrical contact to the underlying P-type region during anodic treatment.

10. The process of claim 5 wherein additionally low resistivity regions are formed which extend completely through said substrate and said first and second epitaxial layers, said low resistivity regions formed by depositing dielectric masking layer portions over a P-type region on said second epitaxial layer, and a dielectric layer masking portion on the bottom of said substrate in opposed relation to said masking portion on said second epitaxial layer,
   the silicon material between said masking portions being shielded from the said anodic treatment.

* * * * *